United States Patent [19]

Ray et al.

[11] Patent Number: 4,671,722

[45] Date of Patent: Jun. 9, 1987

[54] AUTOMATIC POSITIONING OF ELECTRONIC COMPONENTS ON A WALKING BEAM

[75] Inventors: Francis M. Ray, Glenview; Ingard B. Hodne, Northbrook, both of Ill.

[73] Assignee: Zenith Electronics Corporation, Glenview, Ill.

[21] Appl. No.: 792,934

[22] Filed: Oct. 30, 1985

[51] Int. Cl.[4] ...................... B65G 25/02; B65G 57/30; B65G 60/00

[52] U.S. Cl. .................................... 414/32; 198/774; 414/96; 414/126; 414/417

[58] Field of Search ...................... 414/32, 92, 96, 126, 414/222, 403, 416, 417; 29/739, 741; 198/774

[56] References Cited

U.S. PATENT DOCUMENTS

| | | | |
|---|---|---|---|
| 2,744,372 | 5/1956 | Cleaveland et al. | 414/32 X |
| 2,778,174 | 1/1957 | Malone | 414/222 X |
| 2,821,825 | 2/1958 | Gartner | 414/732 X |
| 3,513,990 | 5/1970 | Wolle | 414/32 |
| 3,608,175 | 9/1971 | Lambrecht | 414/417 X |
| 4,054,200 | 10/1977 | Bartos | 198/774 |
| 4,406,572 | 9/1983 | Karcher | 414/32 X |
| 4,522,276 | 6/1985 | Fogg et al. | 414/403 X |

*Primary Examiner*—Leslie J. Paperner
*Attorney, Agent, or Firm*—Cornelius J. O'Connor; Thomas Hill

[57] ABSTRACT

An arrangement for the automatic positioning of axial lead electronic components upon a walking beam includes a tray positioning mechanism and a tray removal mechanism. The tray positioning mechanism in positioned above the walking beam and includes a pair of facing end guides for receiving a plurality of component positioning trays in a stacked arrangement whereon are positioned a plurality of aligned electronic components. The tray positioning mechanism further includes a pair of vertically displaceable support rails for engaging each tray in turn and lowering it beneath the walking beam whereupon all of the components positioned on the tray are removed from the tray and are deposited upon the walking beam. The thus empty tray is then removed from a position adjacent to and straddling the walking beam by a roller assembly which sequentially displaces each emptied tray onto the tray removal mechanism. The tray removal mechanism receives each empty tray in turn and, using a combination of pneumatic valves and cylinders, arranges the trays in a vertically stacked array for re-use.

11 Claims, 6 Drawing Figures

AUTOMATIC POSITIONING OF ELECTRONIC COMPONENTS ON A WALKING BEAM

BACKGROUND OF THE INVENTION

This invention relates generally to the automatic handling of electronic/electrical components and is particularly directed to the automatic positioning of electronic/electrical components upon a walking beam.

Individual electronic or electrical, which terms are intended to have the same meaning in the following discussion, components are typically positioned and connected in circuit by means of high speed automatic handling apparatus for more reliable and less expensive electronic circuit fabrication. Automatic procedures and apparatus are thus increasingly being used in the fabrication and testing of electronic components as well as in the assembly of these components into an operating device. This automation is desirable because of the increased efficiency, reliability, accuracy and speed provided in these heretofore labor-intensive operations. These automated procedures typically involve transporting the components to various stations where they are sequentially manipulated in providing for the fabrication, testing, and insertion of the component in an electronic device. The component is typically transported by means of a conveyor arrangement such as a walking beam for moving the component from station to station. Each component is then sequentially manipulated such as by a robotic grasping arm with pincers for positioning or orienting the component as desired.

In these automatic systems which are frequently microcomputer-controlled, accurate positioning of the electronic components is essential for proper operation. For example, a component on the conveyor system must consistently be positioned within system tolerances at various locations for engagement by component grasping means. Each component must also be accurately and reliably positioned along the length of the conveyor system to provide proper spacing between components and ensure proper timing among the various procedural steps involved. Inherent tolerances in remotely controlled automatic positioning and grasping apparatus, however, frequently result in the inaccurate deposit of a component along the length of the conveyor system. In addition, the inaccurate deposit of a component upon the conveyor system may cause the component to fall or bounce from the conveyor and prevent the completion of its fabrication or subsequent testing and assembly in circuit. The loss of even one component, of course, not only reduces the efficiency and speed of the process, but also increases manufacturing costs.

The present invention addresses all of the aforementioned requirements of automatic electronic component handling apparatus by providing for the high speed, automatic positioning of a plurality of electronic components upon a conveyor arrangement such as a walking beam used in the fabrication and testing of these components as well as in the assembly of these components into an electronic device. The electronic component positioning apparatus of the present invention is fully automatic and eliminates the requirements for operator intervention as well as for the piece-by-piece deposit of individual components upon the component conveyor arrangement.

OBJECTS OF THE INVENTION

Accordingly, it is an object of the present invention to provide for the automatic positioning of electronic components upon a conveyor type of transport system.

It is another object of the present invention to provide for the high speed, automatic handling of large numbers of electronic components.

Yet another object of the present invention is to provide an improved electronic component handling system for use in the automatic assembly of electronic circuits.

A further object of the present invention is to provide for the automatic, continuous and repetitive delivery of electronic components to a designated position and in a desired orientation for subsequent mounting on a circuit board by means of automatic insertion equipment.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
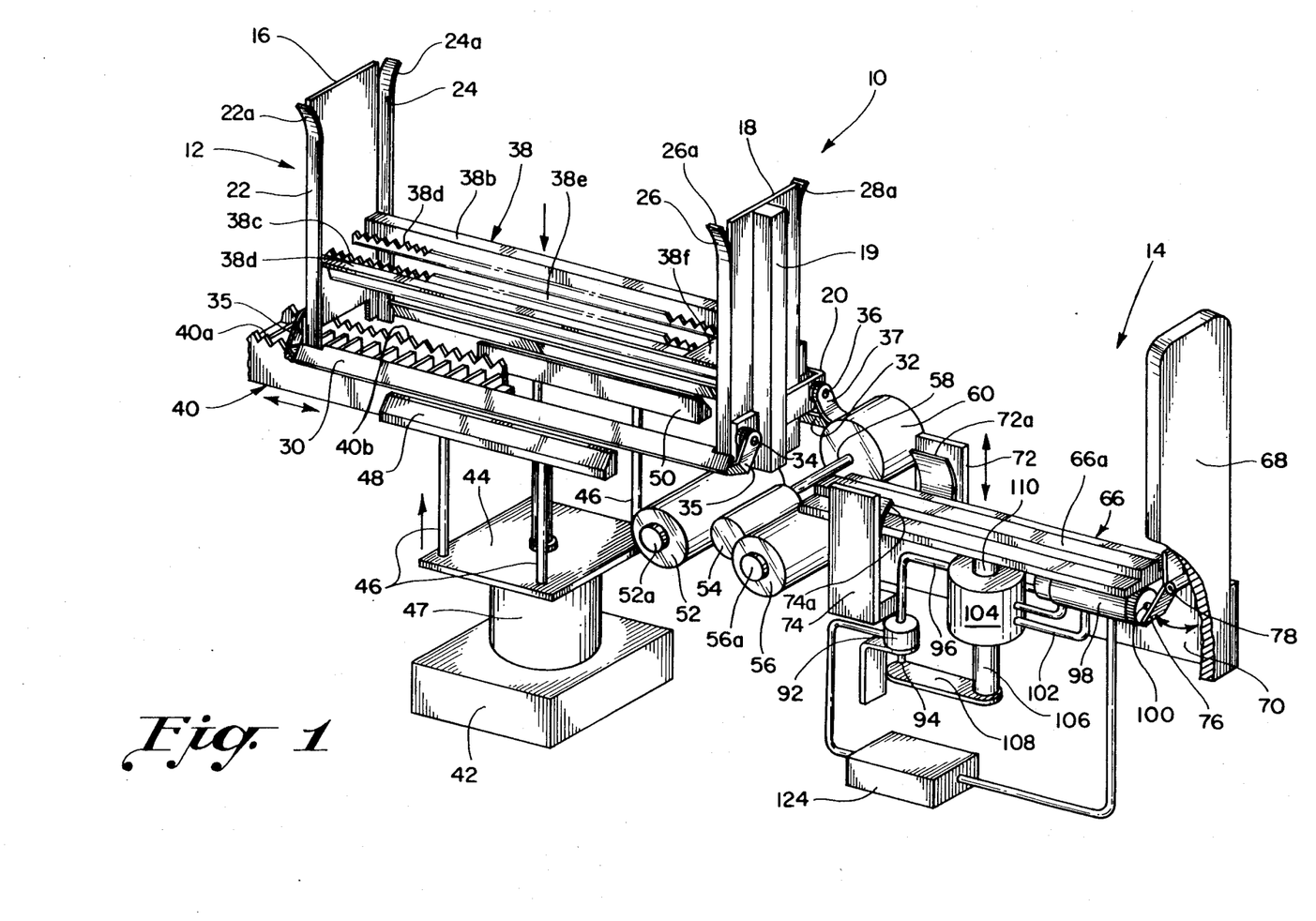
FIG. 1 is a perspective view of an automatic electronic positioning system for depositing electronic components on a walking beam in accordance with the present invention.

Referring to FIG. 1, there is shown a perspective view of an automatic electronic component positioning system 10 in accordance with the principles of the present invention. The component positioning system 10 includes a tray positioning mechanism 12 and a tray removal mechanism 14. The tray positioning and tray removal mechanisms are positioned adjacent to one another and cooperate in the positioning of components upon a walking beam 40 as described in detail below. The configuration and operation of the tray positioning mechanism 12 will now be described in detail with respect to FIGS. 1 and 2 through 4, the latter of which are various sectional views of the tray positioning mechanism portion of the automatic electronic component positioning system.

The tray positioning mechanism 12 includes a generally horizontally aligned U-shaped coupling bracket 20 to respective facing ends of which are mounted first and second end guides 16, 18. Each of the first and second end guides 16, 18 is a generally vertically aligned flat member. The first end guide 16 has attached to lateral portions thereof first and second lateral guides 22, 24. The upper ends of each of the first and second lateral guides 22, 24 are each provided with a respective outwardly angled upper end 22a and 24a. Similarly, a first lateral guide 26 is connected to one lateral edge of the second end guide 18, while a second lateral guide (not shown in FIG. 1) is connected to the opposite lateral edge of the second end guide. Each of the first and second lateral guides connected to the second end guide 18 is provided with a respective outwardly angled upper end 26a, 28a. Securely mounted to an outer surface of the second end guide 18 and extending generally the length thereof is a vertically oriented guide bar 19 for insuring stability of the stack of trays.

Figure 2:
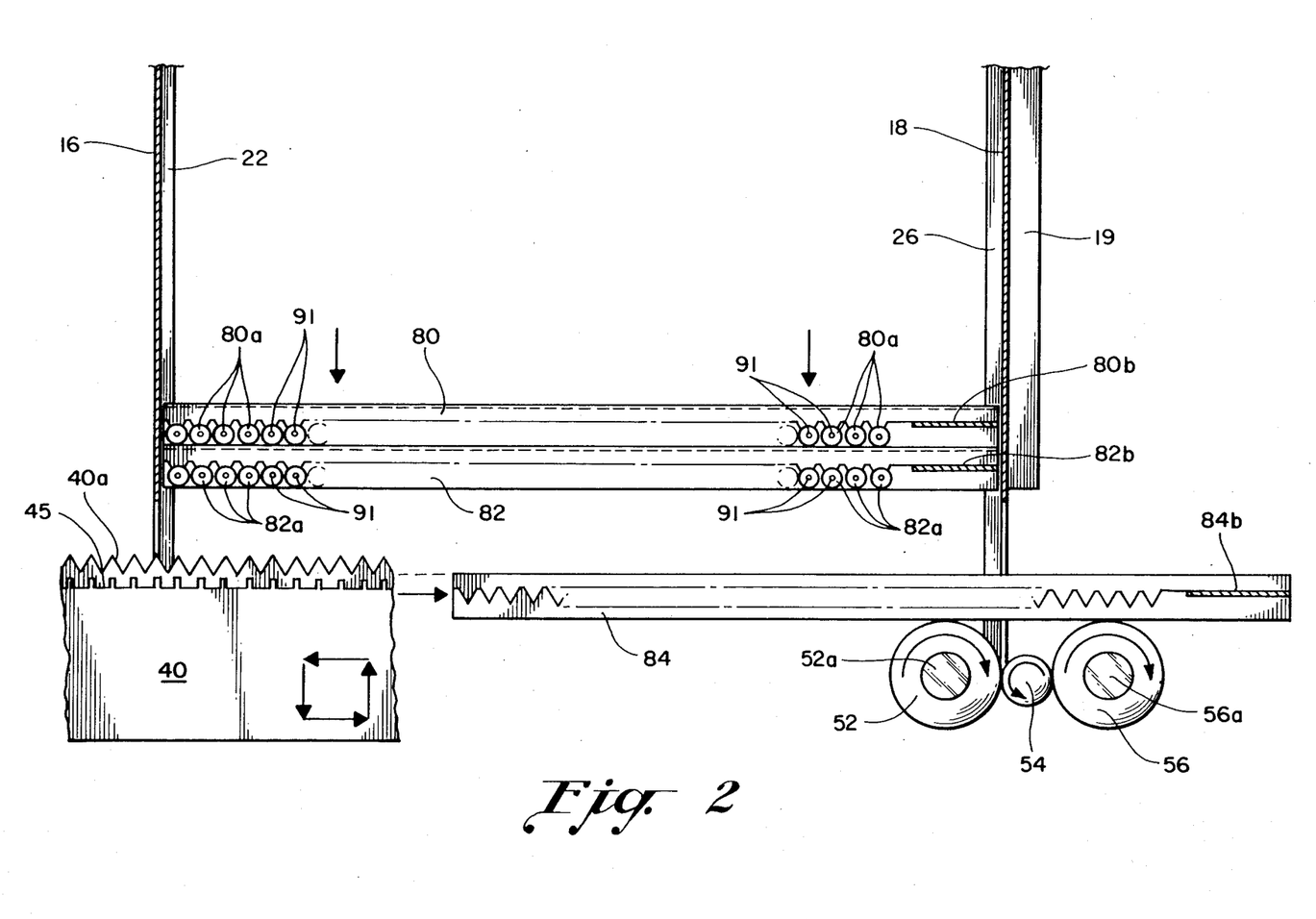
FIG. 2 is a lateral sectional view of the automatic component positioning system of FIG. 1 illustrating the displacement of component positioning trays therein.

The first and second end guides 16, 18 as well as the respective lateral guide portions coupled thereto are adapted to receive a plurality of vertically stacked component positioning trays 38, although only a single component positioning tray is shown in FIG. 1 for simplicity. This is specifically shown in FIG. 2 where an upper component positioning tray 80 rests upon and is supported by a lower component positioning tray 82. As shown in FIG. 1, each component positioning tray 38 is provided with first and second lateral ribs 38a, 38b which extend the length thereof and which are coupled at respective, adjacent ends thereof by a center portion 38f. The first and second lateral ribs 38a, 38b of the component positioning tray 38 are generally parallel and are positioned relative to one another in a spaced manner so as to define a center slot 38e extending substantially the entire length of the component positioning tray. The respective upper inner edge portions of the first and second lateral ribs 38a, 38b are each provided with respective first and second pluralities of notches 38c, 38d positioned thereon. Each of the first plurality of notches 38c is aligned with a corresponding respective notch in the second plurality of notches 38d. The first and second pluralities of notches 38c, 38d are configured and mutually aligned so as to receive a respective axial lead 91, as shown in FIG. 2, of an associated electronic component which are designated as 80a for those components positioned upon the upper component positioning tray 80 and as 82a for those components positioned upon the lower component positioning tray 82. FIG. 2 also illustrates a sectional view of the respective center portions 80b and 82b coupling the first and second lateral ribs of the upper and lower component positioning trays 80, 82.

Pivotally coupled to the outer surfaces of the facing, end portions of the U-shaped coupling bracket 20 are first and second pivoting support brackets 30, 32. The first pivoting support bracket 30 includes a pair of pivot arms 35 each positioned at a respective end thereof and mounted to the U-shaped coupling bracket 20 by means of a respective pivot pin 34. Similarly, the second pivoting support bracket 32 is provided with second pivot arms 37 at respective ends thereof which are each mounted to the U-shaped coupling bracket 20 by means of a pivot pin 36. The first and second pivoting support brackets 30, 32 are thus free to pivot inwardly and outwardly relative to the first and second end guides 16, 18 as shown by the arrows in FIG. 3.

Positioned directly beneath and aligned with the first and second end guides 16, 18 is a conveyor-like walking beam 40. Each of the lateral walls of the walking beam is provided with a respective plurality of notches 40a, 40b on the upper edges thereof. Each notch within the first plurality of notches 40a is aligned in a paired manner with a corresponding notch in the second plurality of notches 40b such that each pair of aligned notches is adapted to receive the axial leads 91 of a single electronic component.

The center portion of the walking beam 40 is adapted to move in a reciprocating manner as shown by the arrows in FIG. 2 and includes a plurality of recesses 45, each of which is aligned with a respective pair of first and second notches 40a, 40b. The recesses 45 in the center movable portion of the walking beam 40 are adapted to receive the body of an electronic component, the axial leads of which are positioned within corresponding, aligned first and second notches 40a, 40b in the lateral walls of the walking beam 40. Thus, when the component positioning tray 38 is displaced downward with the center slot 38e therein positioned above and aligned with the walking beam 40, the axial lead components positioned upon the component positioning tray are transferred to the walking beam when the component positioning tray passes beneath the upper portions of the walking beam containing the aforementioned first and second pluralities of notches 40a, 40b as shown in FIG. 2. In this manner, the electronic components 82a and 80a respectively deposited upon the lower and upper component positioning trays 82, 80 are sequentially transferred to the walking beam 40 which displaces the components positioned thereon in a leftward direction with reference to FIG. 2. Leftward displacement of the walking beam 40 ensures that the first set of electronic components 82a is displaced leftward following their deposit upon the walking beam and that they are removed from immediately beneath the upper component positioning tray 80 to allow the electronic components 80a positioned thereon to be subsequently transferred to the walking beam. The manner in which the component positioning trays are lowered to permit the transfer of electronic components from each tray to the walking beam 40 is described in the following paragraphs.

Figure 3:
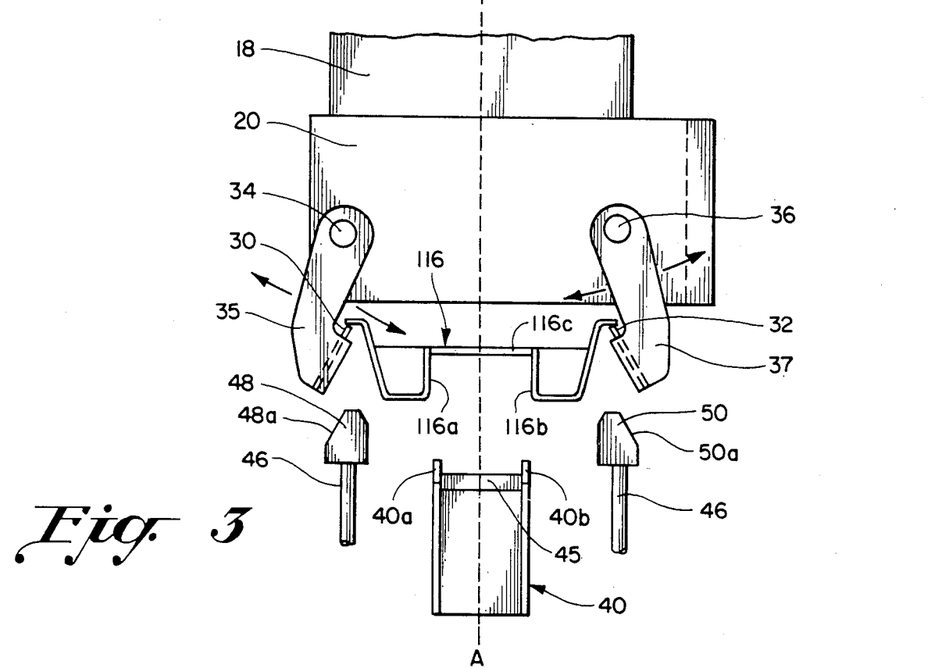
FIG. 3 is a sectional view of the automatic component positioning system of FIG. 1 illustrating the relative positions of the tray positioning mechanism thereof and the walking beam.
Figure 4:
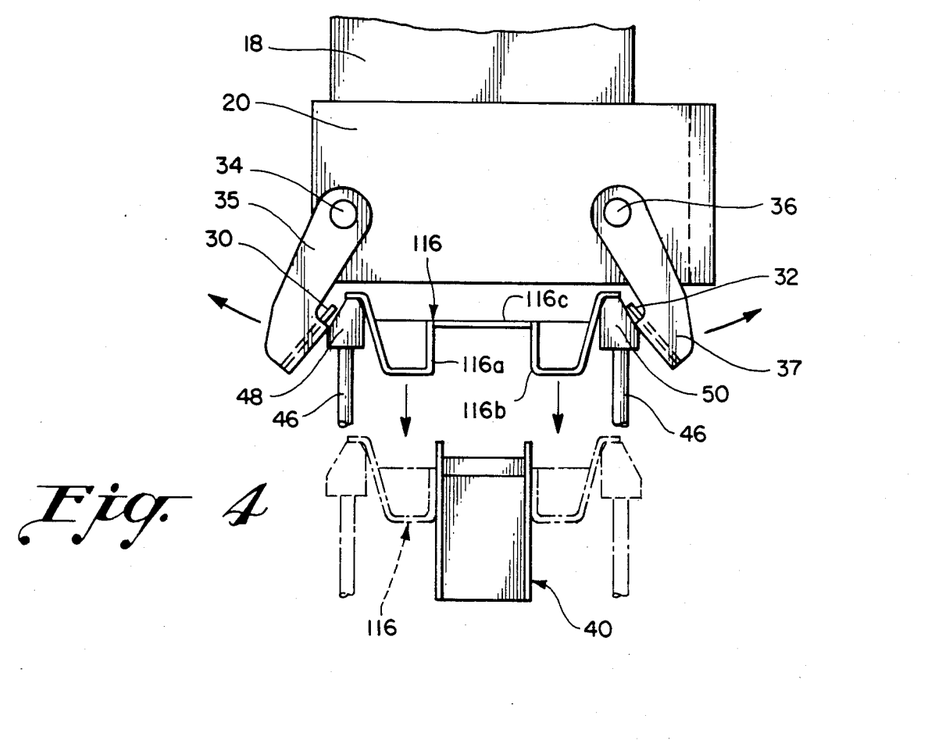
FIG. 4 is a sectional view showing the displacement of the tray positioning mechanism and the component positioning trays during the removal of electronic components therefrom and their positioning upon the walking beam.

Referring specifically to FIGS. 1, 3 and 4, it can be seen that the first and second pivoting support brackets 30, 32 are adapted to engage and support a component positioning tray 116. The component positioning tray 116 includes first and second lateral portions 116a, 116b which are coupled by means of a center portion 116i c at one end of the component positioning tray. As indicated above, the pivot arms 35, 37 are respectively coupled to the U-shaped coupling bracket 20 by means of pivot pins 34 and 36 and are free to pivot inwardly and outwardly relative to a vertical center line drawn through the end portions of the U-shaped bracket 20 and indicated by the line A—A in FIG. 3. As shown in FIG. 3, the first and second pivoting support brackets 30, 32 are adapted to engage respective edges of the first and second lateral portions 116a, 116b of the component positioning tray 116. Although only a single component positioning tray 116 is shown in FIG. 3, typically a plurality of identical component positioning trays would be positioned in a stacked array above and would be supported by the bottom component positioning tray 116 with each tray having a plurality of axial lead electronic components positioned thereon.

Respectively positioned beneath and aligned along the length of the first and second pivoting support brackets 30, 32 are first and second support rails 48, 50. Each of the first and second elongated support rails 48, 50 is coupled to and supported by a pair of support rods 46 which, in turn, are securely mounted to an upper surface of a support platform 44. The support platform 44 is positioned on an upper end of an extendible piston rod 47 which, in turn, is coupled to displacement means 42. The displacement means 42 may be any conventional mechanism, such as a pneumatic cylinder, for vertically displacing in a periodic manner the combination of the piston rod 47, the support platform 44, the support rods 46 and the first and second support rails 48, 50.

Each of the first and second support rails 48, 50 includes a respective inclined, upper, outer edge portion 48a, 50a which is adapted to engage a respective lower end portion of the first and second pivot arms 35, 37 when displaced upward by means of the displacement means 42. Upward displacement of the first and second support rails 48, 50 and engagement with a corresponding first and second pivot arm 35, 37 results in the outward displacement of the aforementioned pivot arms as well as the respective support brackets 30, 32 coupled thereto and the release of the component positioning tray 116 therefrom. As shown in FIG. 4, with the first and second pivot arms 35, 37 respectively displaced outwardly by the first and second support rails 48, 50, these support rails respectively engage outer edge portions of the first and second lateral portions 116a, 116b of the component positioning tray 116. Downward displacement of the first and second support rails 48, 50 by the displacement means 42 lowers the component positioning tray 116 to a position beneath the upper edge portions of the walking beam 40 as shown in dotted line form in FIG. 4. With the component positioning tray 116 thus lowered beneath the upper edge portions of the walking beam 40, the electronic components positioned upon the component positioning tray 116 are removed therefrom and transferred to the first and second pluralities of notches 40a, 40b in the walking beam 40. The center portion 116c of the component positioning tray 116 is positioned adjacent to and beyond the end of the walking beam to allow the walking beam to be positioned within the positioning tray's center slot 38e allowing the positioning tray to be displaced downwardly adjacent to each lateral portion of the walking beam and to be removed from a position adjacent to the walking beam as described in the following paragraphs.

As shown in FIGS. 1 and 2, the tray removal mechanism 14 includes first, second and third rollers 52, 54 and 56. The second roller 54, which is positioned between the first and third rollers 52, 56 and in contact therewith, is coupled to a drive motor 60 by means of a coupling shaft 58. The first and third rollers 52, 56 are similarly mounted to and supported by respective support shafts 52a and 56a. Rotation of the drive motor 60 results in a corresponding rotational displacement of the second roller 54 which, since the second roller is in contact with the first and third rollers 52, 56, results in the rotation of these latter two rollers in an opposite direction from the rotation of the second roller as shown in FIG. 2. This figure indicates that clockwise rotation of the first and third rollers 52, 56 with an empty component positioning tray 84 positioned thereon will result in the rightward displacement of this component positioning tray. The center portion 84b of the empty component positioning tray 84 is shown in the sectional view of FIG. 2. Motor 60 may be any conventional driver that provides for the continuous rotation of roller 54 and thereby the combination of the first and third rollers 52 and 56 and the removal from beneath the tray positioning mechanism 12 of an empty component positioning tray following the removal of electronic components therefrom and their deposit upon the walking beam 40. Thus, while the dombination of the aforementioned rollers undergoes continuous rotation, the first and second support rails 48, 50 undergo periodic vertical displacement for engaging and removing a component positioning tray from the first and second pivoting support brackets 30, 32 when in the fully upraised position and for lowering the component positioning tray to a position in contact with the first and third rollers 52, 56 whereby the empty component positioning tray is laterally displaced and removed from beneath the tray positioning mechanism 12.

Figure 5:
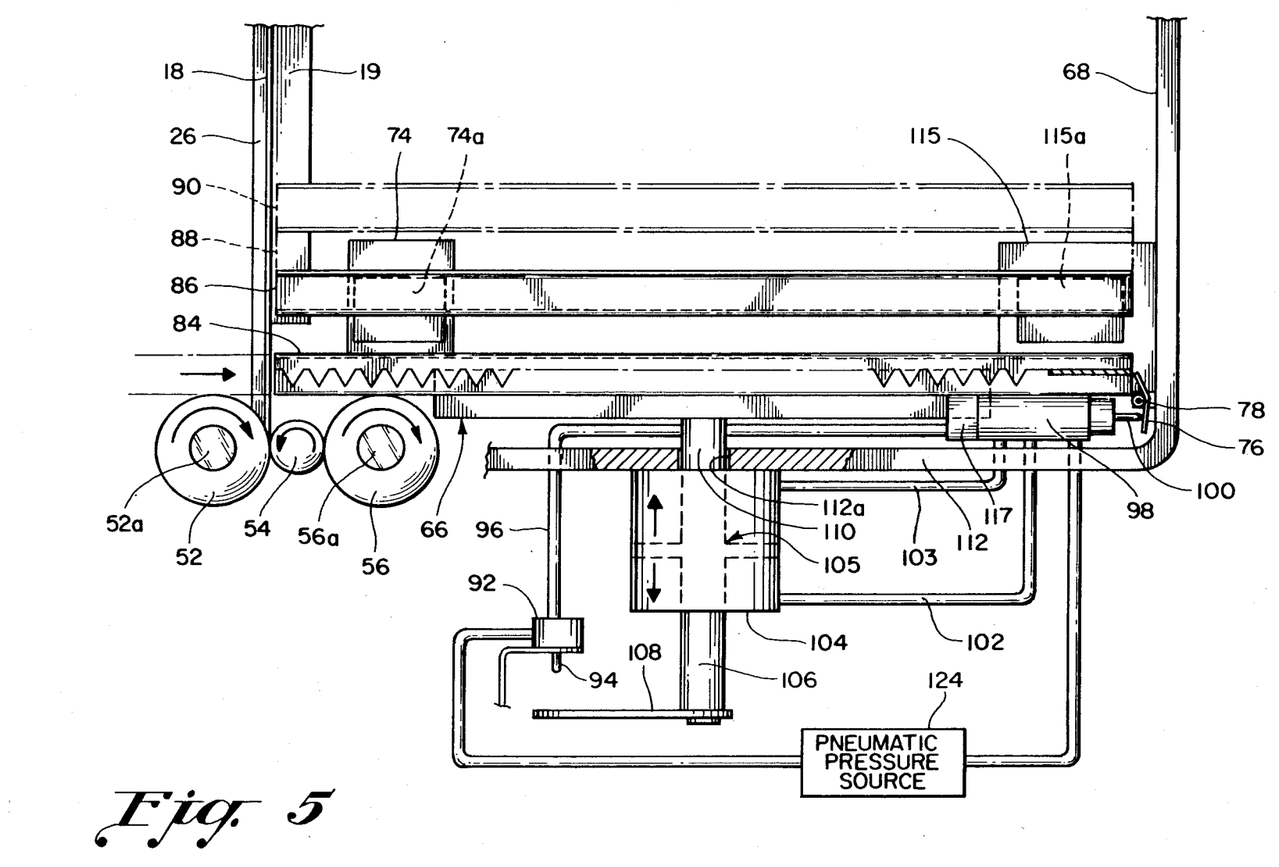
FIG. 5 is a lateral sectional view of the component positioning tray removal mechanism of the automatic component positioning system of FIG. 1.
Figure 6:
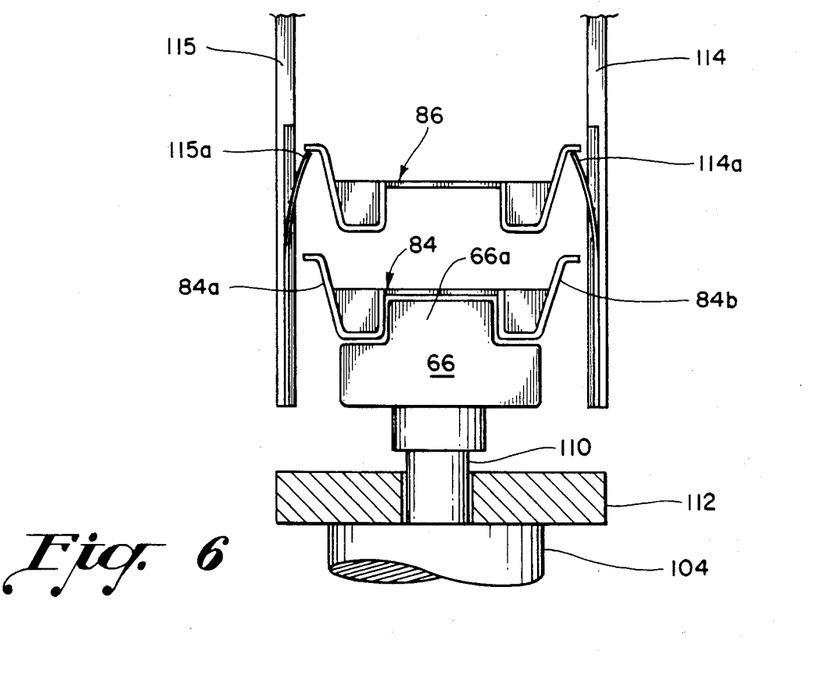
FIG. 6 is a sectional view of the tray removal mechanism of the automatic component positioning system of the present invention illustrating the manner in which the empty component positioning trays are stacked in a generally vertical array following removal of electronic oomponents therefrom.

Referring to FIGS. 1, 5 and 6, there are shown additional details of the tray removal mechanism 14. The tray removal mechanism 14 is adapted to receive the empty component positioning trays from the tray positioning mechanism 12 as just described and to arrange the empty component positioning trays in a generally vertical stacked array to facilitate their removal and the positioning of additional electronic components thereon for re-insertion in the tray positioning mechanism.

The tray removal mechanism 14 includes, in addition to the aforementioned combination of rollers, a tray support bracket 66 and an end bracket 68. The tray support bracket 66 includes an upraised center portion 66a and is adapted to support in sliding engagement an empty component positioning tray laterally displaced by the first and third rollers 52, 56, and to provide support therefor. The upraised center portion 66a of the tray support bracket 66 is positioned between the first and second lateral portions 84a, 84b of a component positioning tray 84 positioned thereon as shown in FIG. 6

Positioned on the inner surface of the end bracket 68 by means of a pivot pin 78 is an actuator 76. Rightward displacement of the empty component positioning tray 84 causes the forward portion of the positioning tray to engage and displace rightward an upper portion of the pivoting actuator 76. In response to the rightward displacement of an upper end portion of the actuator 76, a lower portion of the actuator is displaced leftward and engages and displaces an actuator pin 100. The actuator pin 100 is positioned within and coupled to a four-way pneumatic valve 98 which, in turn, is coupled to a source of pneumatic pressure 124. The valve 98 is further coupled by means of tubing 102 to a lower portion of a pneumatic cylinder 104. Positioned within the cylinder 104 and movable therein is a piston rod 105 having an upper end portion 110 and a lower end portion 106. The pneumatic cylinder 104 is mounted to the lower surface of a generally horizontally oriented support bracket 112 which may be either coupled to or integral with the end bracket 68. The support bracket 112 includes an aperture 112a therein through which the upper end portion 110 of the piston rod 105 is inserted. Mounted to the upper end portion 110 of the piston rod 105 is the tray support bracket 66. With the four-way pneumatic valve 98 actuated by engagement of the actuator pin 100 by the pivoting actuator 76, a gas such as air is directed under pressure through the tubing 102 into the lower portion of the cylinder 104 forcing the piston rod 105 therein upward resulting in the upward vertical displacement of the tray support bracket 66 and the empty component positioning tray 84 positioned thereon.

Positioned adjacent to respective lateral edges of the tray support bracket 66 and aligned generally vertically are a pair of forward support brackets 72 and 74 and a pair of aft support brackets 114 and 115. The forward support brackets 72, 74 are shown in FIG. 1, while the aft support brackets 114, 115 are shown in the sectional view of FIG. 6. Each of the forward support brackets 72, 74 is provided with a respective inwardly curved resilient member 72a, 74a. Similarly, each of the aft support brackets 114, 115 is provided with a respective inwardly curved resilient member 114a, 115a. Upward displacement of the empty component positioning tray 84 by the tray support bracket 66 results in engagement of the lateral edge portions of the empty component positioning tray by the aforementioned inwardly curved resilient members 72a, 74a and 114a, 115a which are deflected outwardly. Further upward vertical displacement of the empty component positioning tray results in the positioning of the tray above the aforementioned inwardly curved resilient members allowing these resilient members to assume their normal, inwardly deflected orientation and to engage respective lateral edge portions of the component positioning tray and to provide support therefor. This is shown for the case of empty component positioning tray 86 in FIG. 6 wherein the empty component positioning tray rests upon and is supported by the aforementioned four inwardly curved resilient members. While not shown in FIG. 6, additional empty component positioning trays may be positioned upon the upper component positioning tray 86 and may also be supported by the aforementioned four inwardly curved resilient members. After an empty component positioning tray is displaced upward to a point where it is supported by the aforementioned inwardly curved resilient members, the tray support bracket 66 is displaced downwardly as described below to assume a position for accepting and supporting the next empty component positioning tray removed from the tray positioning mechanism 12 of the automatic component positioning system 10. In this manner, a plurality of empty component positioning trays as illustrated for the case of trays 86, 88 and 90 in FIG. 5 may be arranged in a vertically stacked array by the tray removal mechanism 14 for re-use in the automatic component positioning system 10.

Following upward displacement of the empty component positioning tray 84 to a point where it is positioned above and supported by the forward and aft pairs of inwardly curved resilient members 72a, 74a and 114a, 115a, an actuating arm 108 positioned on the lower end of the lower end portion 106 of the piston rod 105 engages an actuator pin 94 coupled to a pneumatic limit valve 92. The pneumatic limit valve 92 is coupled to the source of pneumatic pressure 124 and is further coupled to an actuator 117 mounted to the four way valve 98. Engagement of the actuator pin 94 by the actuating arm 108, causes the pneumatic limit valve 92 to deliver a gas such as air under pressure to the actuator 117 via tubing 96, see FIG. 5. Operation of actuator 117 shifts the four way valve 98 causing it to apply gas pressure to the cylinder 104 via tubing 103 which, in turn, causes a downward displacement of the piston rod 105 within the pneumatic cylinder 104 and a lowering of the tray support bracket 66 mounted to the upper end portion 110 of the piston rod. It is in this manner that the tray support bracket 66 is lowered to its original position for receiving in sliding engagement the next empty component positioning tray removed from the tray positioning mechanism 12 and for providing support therefor. It should be noted here that upon upward vertical displacement of the empty component positioning tray 84 by the pneumatic cylinder 104, the empty component positioning tray no longer engages the actuator 76 which in turn, is then free to pivot counterclockwise as shown in FIG. 5.

There has thus been shown an automatic electronic component positioning system for simultaneously depositing a plurality of electronic components upon a linearly displaced conveyor system such as a walking beam as used in the automatic assembly, testing and positioning in circuit of electronic components. The automatic positioning system provides for the transfer of electronic components from a stacked arrangement of component positioning trays to the linearly displaced walking beam and for the re-stacking of the component positioning trays following the removal of components therefrom for re-use.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In the automatic handling of electronic components having a pair of axial leads wherein the electronic components are displaced by a walking beam, apparatus for simultaneously positioning a plurality of electronic components upon the walking beam comprising:

first and second component positioning trays each including a slot extending from an end and substanially the length thereof and further including first and second pluralities of the linearly aligned notches on respective lateral edges thereof and extending substanially the length thereof, said component positioning trays having positioned in a linear array within the respective first and second pluralities of linearly aligned notches first and second respective pluralities of the electronic components;

tray positioning means for maintaining said first and second component positioning trays in a generally vertical stacked array, wherein said first component positioning tray is positioned beneath and supports said second component positioning tray, and for displacing said first component positioning tray immediately adjacent to the walking beam whereupon said first plurality of electronic components is engaged by and transferred to the walking beam while maintaing said second component positioning tray in position relative to the walking beam; and tray removal means positioned adjacent to said tray positioning means for engaging and displacing said first component positioning tray from said tray positioning means following the removal of said first plurality of electronic components from said first component positioning tray whereupon said second component positioning tray is displaced by said tray positioning means immediately adjacent to the walking beam, wherein an end of said walking beam is positioned within the slot of said first component positioning tray and intermediate the first and second pluralities of linearly aligned notches on the respective lateral edges of said first component positioning tray as said first component positioning tray is displaced immediately adjacent to the walking beam, and wherein said second plurality of electronic components is engaged by and transferred to the walking beam, said tray removal means including roller means for supporting and displacing said first component positioning tray from said rails are lowered below said walking beam.

2. The apparatus of claim 1 wherein said tray positioning means displaces said first and second component positioning trays vertically downward immediately adjacent to said walking beam whereupon said first plurality of electronic components are lifted from a component positioning tray as the component positioning tray is displaced below said walking beam.

3. The apparatus of claim 2 wherein said tray positioning means includes a plurality of parallel, spaced, generally vertically oriented tray guides for maintaining said first and second component positioning trays in a generally vertically stacked array.

4. The apparatus of claim 3 wherein said tray positioning means further includes retention means coupled to said tray guides for supporting said first and second component positioning trays.

5. The apparatus of claim 4 wherein said retention means includes first and second laterally spaced, parallel support brackets each pivotally coupled to said tray guides.

6. The apparatus of claim 5 wherein said tray positioning means further includes support means for engaging a component positioning tray when positioned upon said support brackets and for removing said component positioning tray therefrom and for displacing said component positioning tray immediately adjacent to said walking beam.

7. The apparatus of claim 6 wherein said support means includes a pair of laterally spaced, parallel rails in combination with first displacement means for lowering said rails with the component positioning tray positioned thereon below said walking beam.

8. The apparatus of claim 7 wherein said tray removal means further includes a generally horizontally oriented support beam aligned with said roller means and said rails for receiving and supporting the thus displaced component positioning tray.

9. The apparatus of claim 8 wherein said tray removal means further includes a plurality of generally vertically oriented support brackets positioned adjacent to said support beam for maintaining the thus displaced component positioning trays in a generally vertically stacked array.

10. The apparatus of claim 9 wherein said tray removal means further includes second displacement means coupled to said support beam for vertically displacing upward said support beam and a component positioning tray positioned thereon in arranging said component positioning trays in a generally vertically stacked array.

11. The apparatus of claim 10 wherein each of said support brackets includes an inwardly curved resilient member for engaging a last component positioning tray displaced upward by said second displacement means and for supporting said last component positioning tray displaced upward as well as other component positioning trays positioned thereon in a generally vertically stacked array.

* * * * *